(12) United States Patent
Kim et al.

(10) Patent No.: US 11,424,426 B2
(45) Date of Patent: Aug. 23, 2022

(54) WHITE ORGANIC LIGHT EMITTING DEVICE AND ORGANIC LIGHT EMITTING DISPLAY DEVICE USING THE SAME

(71) Applicant: LG Display Co., Ltd., Seoul (KR)

(72) Inventors: Seung-Hyun Kim, Goyang-si (KR);
Yong-Hwan Kim, Seoul (KR);
Young-Kwan Jung, Paju-si (KR);
Hee-Yeol Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 110 days.

(21) Appl. No.: 16/170,030

(22) Filed: Oct. 25, 2018

(65) Prior Publication Data

US 2019/0131556 A1 May 2, 2019

(30) Foreign Application Priority Data

Oct. 27, 2017 (KR) .......................... 10-2017-0141207

(51) Int. Cl.
*H01L 27/32* (2006.01)
*H01L 51/50* (2006.01)
*H01L 51/52* (2006.01)

(52) U.S. Cl.
CPC ........ *H01L 51/504* (2013.01); *H01L 27/3209* (2013.01); *H01L 51/5056* (2013.01); *H01L 51/5072* (2013.01); *H01L 51/5092* (2013.01); *H01L 51/5234* (2013.01); *H01L 51/5278* (2013.01); *H01L 27/322* (2013.01); *H01L 51/5218* (2013.01); *H01L 2251/5315* (2013.01); *H01L 2251/5376* (2013.01); *H01L 2251/558* (2013.01)

(58) Field of Classification Search
CPC ............... H01L 51/504; H01L 51/5278; H01L 51/5072; H01L 51/5056; H01L 51/5234; H01L 51/5092; H01L 51/5218; H01L 27/3209; H01L 2251/5376; H01L 2251/558; H01L 2251/5315; H01L 51/5265

See application file for complete search history.

(56) References Cited

U.S. PATENT DOCUMENTS 10,431,776 B2    10/2019  Song et al.
2005/0280002 A1*  12/2005  Kang ................... H01L 27/3248
                                                              257/72

(Continued)

FOREIGN PATENT DOCUMENTS

KR    10-2013-0051875 A    5/2013
KR    10-2014-0079273 A    6/2014
KR    10-2015-0025727 A    3/2015

OTHER PUBLICATIONS

Korean Intellectual Property Administration, Office Action, KR Patent Application No. 10-2017-0141207, dated Jun. 22, 2021, 19 pages.

*Primary Examiner* — Stephen M Bradley
*Assistant Examiner* — Gustavo G Ramallo
(74) *Attorney, Agent, or Firm* — Fenwick & West LLP

(57) ABSTRACT

A white organic light emitting device and an organic light emitting display device using the white organic light emitting device stably implement white light in a tandem-type top emission structure through uniform lifespans according to emitted colors of light despite driving of the white organic light emitting device for a long time.

18 Claims, 7 Drawing Sheets
(4 of 7 Drawing Sheet(s) Filed in Color)

(56) References Cited

U.S. PATENT DOCUMENTS

| | | | |
|---|---|---|---|
| 2007/0222371 A1* | 9/2007 | Raychaudhuri | H01L 51/5215 313/504 |
| 2007/0296334 A1* | 12/2007 | Matsuda | H01L 51/5262 313/506 |
| 2008/0203908 A1* | 8/2008 | Hasegawa | H01L 51/5253 313/504 |
| 2013/0119357 A1* | 5/2013 | Kim | H01L 51/5048 257/40 |
| 2014/0167015 A1* | 6/2014 | Lee | H01L 51/5012 257/40 |
| 2014/0167016 A1* | 6/2014 | Yoo | H01L 27/3209 257/40 |
| 2015/0060825 A1* | 3/2015 | Song | H01L 51/5278 257/40 |
| 2015/0155513 A1* | 6/2015 | Pieh | H01L 51/5278 257/40 |

\* cited by examiner

WHITE ORGANIC LIGHT EMITTING DEVICE AND ORGANIC LIGHT EMITTING DISPLAY DEVICE USING THE SAME

This application claims the benefit of Republic of Korea Patent Application No. 10-2017-0141207, filed on Oct. 27, 2017, which is hereby incorporated by reference in its entirety.

BACKGROUND

Field of the Disclosure

The present disclosure relates to an organic light emitting device, and more particularly, to a white organic light emitting device and an organic light emitting display device using the same which stably implement white light in a tandem-type top emission structure through uniform lifespans according to emitted colors of light despite driving of the white organic light emitting device for a long time.

Discussion of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tubes (CRTs).

As examples of flat display devices, there are a liquid crystal display (LCD), a plasma display panel (PDP), a field emission display (FED), an organic light emitting display (OLED), etc.

Particularly, in order to omit a separate light source and to achieve device compactness and clear color display, an organic light emitting display device is considered as a competitive application.

Such an organic light emitting display device essentially requires formation of an organic light emitting layer and, in order to form the organic light emitting layer, a deposition method using a shadow mask is conventionally used.

However, if the shadow mask is applied to a large area, sagging of the shadow mask occurs due to the load thereof and, thereby, it is difficult to use the shadow mask several times and a defect in formation of an organic light emitting layer pattern occurs. Thus, alternatives are required.

As one of various methods suggested as a substitute for the above shadow mask, a tandem-type white organic light emitting device (hereinafter, referred to as a "white organic light emitting device") is proposed. Hereinafter, the white organic light emitting device will be described.

The white organic light emitting device, in which each of layers between an anode and a cathode are deposited without a mask during formation of light emitting diodes, is characterized in that organic films including organic light emitting layers are sequentially formed by depositing different components in a vacuum state. Further, the white organic light emitting device includes different light emitting layers, which emit light of a plurality of colors, between the anode and the cathode, and a charge generation layer is provided between the respective light emitting layers and, thus, stacks are divided from each other based on a basic structure using each light emitting layer.

In the white organic light emitting device, light is not emitted using one material, but the light emitting layers including luminescent materials having different photoluminescence (PL) peaks according to wavelengths emit different colors of light at different positions within the device and the different colors of light are combined at an upper electrode (the anode or the cathode), from which light is output, thus producing white light. For example, a white organic light emitting device may be implemented by stacking a stack including a fluorescent light emitting layer and a stack including phosphorescent light emitting layer.

Further, bottom emission type white organic light emitting devices are mainly used at present. In this case, loss of an emission area occurs as much as an area of a circuit required in an active area and, in order to increase the emission area, top emission type white organic light emitting devices, in which a circuit area required by each sub-pixel is covered with a reflective electrode and the area of the reflective electrode is used as an emission area, are considered now. However, the conventional top emission type white organic light emitting devices are disadvantageous in that they do not have sufficient efficiency and color characteristics are changed in case of driving of the white organic light emitting device for a long time due to different efficiencies of colors of light. Further, a specific color of light has a short lifespan and, thus, it is difficult to use the conventional top emission type white organic light emitting devices as a reliable display device.

SUMMARY OF THE DISCLOSURE

Accordingly, the present disclosure is directed to a white organic light emitting device and an organic light emitting display device using the same that substantially obviate one or more problems due to limitations and disadvantages of the related art.

An object of the present disclosure is to provide a white organic light emitting device and an organic light emitting display device using the same in which an emission area is increased through a top emission type structure and white light is stably implemented through uniform lifespans according to emitted colors of light despite driving of the white organic light emitting device for a long time.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a white organic light emitting device includes a reflective electrode, a first transparent electrode on the reflective electrode, a first blue stack on the first transparent electrode, the first blue stack including a first common layer, a first blue light emitting layer and a second common layer, a phosphorescent stack on the first blue stack, the phosphorescent stack including a third common layer, a phosphorescent light emitting layer and a fourth common layer, a second blue stack on the phosphorescent stack, the second blue stack including a fifth common layer, a second blue light emitting layer and a sixth common layer, a second transparent electrode on the second blue stack, and a light compensation layer on the second transparent electrode, wherein a ratio of a first distance from an upper surface of the reflective electrode to a lower surface of the first blue light emitting layer to a second distance from the lower surface of the first blue light emitting layer to a lower surface of the phosphorescent light emitting layer to a third distance from the lower surface of the phosphorescent light emitting layer to a lower surface of the second blue light emitting layer to a fourth distance from the lower surface of the second blue light emitting layer to an upper surface of the light compensation layer is 2:1:1.5:4.

The phosphorescent light emitting layer may include a red light emitting layer and a yellow-green light emitting layer that contact each other.

Peak wavelengths of the first blue light emitting layer and the second blue light emitting layer may be within a wavelength range of 430 nm to 460 nm, a peak wavelength of the red light emitting layer may be within a wavelength range of 620 nm to 640 nm, and a peak wavelength of the yellow-green light emitting layer may be within a wavelength range of 520 nm to 560 nm.

The first distance may be 1,200 Å to 1,300 Å.

The first transparent electrode may have a thickness of 500 Å or more, and a thickness of the first common layer may be greater than the thickness of the first transparent electrode.

The white organic light emitting device according may further include a first charge generation layer provided between the first blue stack and the phosphorescent stack, and a second charge generation layer provided between the phosphorescent stack and the second blue stack.

The first common layer, the third common layer and the fifth common layer may include at least one hole transport layer, the second common layer, the fourth common layer and the sixth common layer may include at least one electron transport layer, and, among the first to sixth common layers, the first common layer may have a greatest thickness.

A total thickness from the first transparent electrode to the light compensation layer may be 5,100 Å to 5,250 Å.

The light compensation layer may have a refractive index of 1.9 or more and a thickness of 800 Å to 1,200 Å.

The second transparent electrode may have a thickness of 300 Å to 600 Å less than a thickness of the first transparent electrode.

In another aspect of the present disclosure, an organic light emitting display device includes a substrate, a plurality of sub-pixels, a driving transistor in each of the plurality of sub-pixels on the substrate, a reflective electrode connected to the driving transistor, a first transparent electrode on the reflective electrode, a first blue stack on the first transparent electrode, the first blue stack including a first common layer, a first blue light emitting layer and a second common layer, a phosphorescent stack on the first blue stack, the phosphorescent stack including a third common layer, a phosphorescent light emitting layer and a fourth common layer, a second blue stack on the phosphorescent stack, the second blue stack including a fifth common layer, a second blue light emitting layer and a sixth common layer, a second transparent electrode on the second blue stack, a light compensation layer on the second transparent electrode, and a color filter layer that corresponds to at least one of the plurality of sub-pixels on the light compensation layer, wherein a ratio of a first distance from an upper surface of the reflective electrode to a lower surface of the first blue light emitting layer to a second distance from the lower surface of the first blue light emitting layer to a lower surface of the phosphorescent light emitting layer to a third distance from the lower surface of the phosphorescent light emitting layer to a lower surface of the second blue light emitting layer to a fourth distance from the lower surface of the second blue light emitting layer to an upper surface of the light compensation layer is 2:1:1.5:4.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
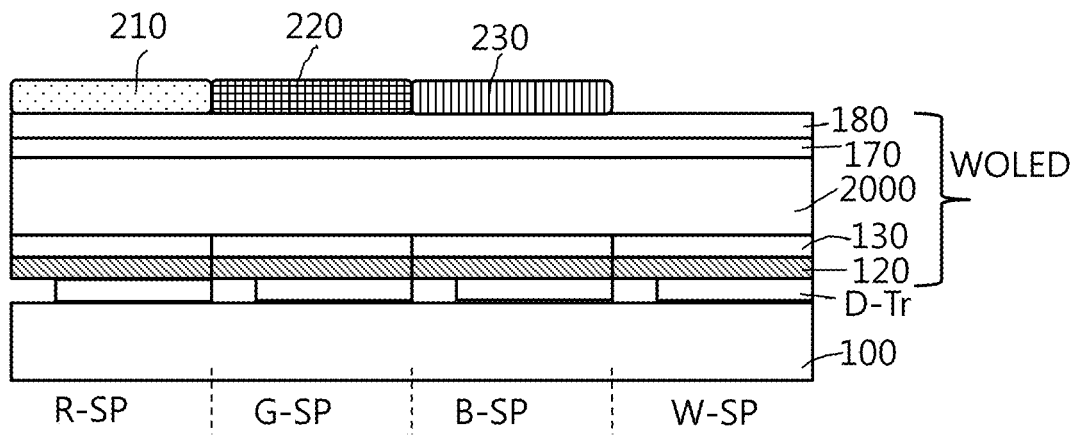
FIG. 1 is a cross-sectional view schematically illustrating an organic light emitting display device in accordance with an embodiment of the present disclosure.

Reference will now be made in detail to the preferred embodiments of the present disclosure, examples of which are illustrated in the accompanying drawings. However, the present disclosure may be embodied in many alternative forms and should not be construed as limited to the embodiments set forth herein, and the embodiments of the present disclosure are provided only to completely disclose the disclosure and to completely inform those skilled in the art of the scope of the disclosure. Therefore, it should be understood that there is no intent to limit the disclosure to the particular forms disclosed, but on the contrary, the disclosure is to cover all modifications, equivalents, and alternatives within the spirit and scope of the disclosure as defined by the claims.

Shapes, sizes, rates, angles, numbers, etc. disclosed in the drawings to describe the embodiments of the present disclosure are only exemplary and do not limit the present disclosure. In the following description of the embodiments and the drawings, the same or similar elements are denoted by the same reference numerals even though they are depicted in different drawings. In the following description of the embodiments of the present disclosure, a detailed description of known functions and configurations incorporated herein will be omitted when it may make the subject matter of the present disclosure rather unclear. In the following description of the embodiments, the terms "including" and "having" will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same. It will be understood that a singular expression includes a plural expression unless otherwise stated.

In interpretation of elements included in the various embodiments of the present disclosure, it will be interpreted that the elements include error ranges unless otherwise stated.

In the following description of the embodiments, it will be understood that, when positional relations are expressed, for example, when an element is 'on', 'above', 'under', 'beside', etc. another element, the two elements may directly contact each other, or one or more other elements may be interposed between the two elements unless the term 'immediately' or 'directly' is used.

In the following description of the embodiments, it will be understood that, when temporal relations are expressed, for example, the term expressing a sequence of events, such as 'after', 'subsequent to', 'next to' or before' may encompass continuous relationship between the events, or discontinuous relationship between the events unless the term 'immediately' or 'directly' is used.

Characteristics of the various embodiments of the present disclosure may be partially or wholly connected to or combined with each other and technically variously driven and interlocked with each other, and the various embodiments may be independently implemented or be implemented together in connection with each other.

In the following description of the embodiments, the term 'doped' means that, to a material occupying a greater part of the weight ratio of a layer, 10% by weight or less of a material having different physical properties from the material occupying the greater part of the weight ratio (different physical properties meaning, for example, an N-type and a P-type, or organic material and an inorganic material) is added. In other words, a 'doped' layer means a layer in which a host material and a dopant material may be discriminated in consideration of weight ratio. Further, the term 'undoped' encompasses all cases except for a case corresponding to the term 'doped'. For example, if a layer includes a single material or includes a mixture of materials having similar or equal properties, such a layer corresponds to an 'undoped' layer. For example, if at least one of materials forming a layer is P-type and all the materials forming the layer are not N-type, such a layer corresponds to an 'undoped' layer. For example, if at least one of materials forming a layer is an organic material and all the materials forming the layer are not inorganic materials, such a layer corresponds to an 'undoped layer'. For example, if all materials forming a layer are organic materials, at least one of the materials forming the layer is N-type and at least another one of the materials forming the layer is P-type, when the N-type material constitutes less than 10% by weight or the P-type material constitutes less than 10% by weight, such a layer corresponds to a 'doped' layer.

In the following description of the embodiments, an electroluminescence (EL) spectrum is calculated by multiplying (1) a photoluminescence (PL) spectrum, in which unique characteristics of a luminescent material, such as a dopant material or a host material included in an organic light emitting layer, are reflected, by (2) an out-coupling emittance spectrum curve, determined according to the structure and optical characteristics of an organic light emitting device including thicknesses of organic layers, such as an electron transport layer, etc.

In the following description of the embodiments, a stack means a unit structure including a hole transport layer, organic layers including the hole transport layer, and an organic light emitting layer arranged between the hole transport layer and an electron transport layer. The organic layers may further include a hole injection layer, an electron barrier layer, a hole barrier layer, the hole injection layer, etc., and the stack may further include other organic layers according to the structure or design of an organic light emitting device.

Hereinafter, an organic light emitting display device, and a white organic light emitting device and a circuit, which are used in the organic light emitting display device, will be described and effects thereof will be compared with an organic light emitting display device in accordance with a comparative example.

FIG. 1 is a cross-sectional view schematically illustrating an organic light emitting display device in accordance with the present disclosure.

As exemplarily shown in FIG. 1, the organic light emitting display device in accordance with the present disclosure includes a substrate 100 including a plurality of sub-pixels, a pixel circuit including a driving thin film transistor D-Tr and provided in each sub-pixel, a white organic light emitting device WOLED conductively connected to the driving thin film transistor D-Tr, and color filter layers 210, 220 and 230 provided so as to correspond to the respective sub-pixels.

The substrate 100 may be an insulating substrate formed of plastic, glass or ceramic. If the substrate 100 is formed of plastic, the substrate 100 may have slimness and flexibility. However, the material of the substrate 100 is not limited thereto, and the substrate 100 may further include an insulating buffer layer provided at a side thereof including metal and provided with wirings formed thereon.

For example, four sub-pixels, i.e., a red sub-pixel R-SP, a green sub-pixel G-SP, a blue sub-pixel B-SP and a white sub-pixel W-SP, may form one pixel, as exemplarily shown in this figure, or three sub-pixels, i.e., a red sub-pixel R-SP, a green sub-pixel G-SP and a blue sub-pixel B-SP without a white sub-pixel W-SP, may form one pixel. As circumstances require, one pixel may be defined as a combination of three or more sub-pixels emitting different colors of light, such as red/green/blue.

In the organic light emitting display device in accordance with the present disclosure, all the sub-pixels have the white organic light emitting device WOLED in common, and the color filter layers 210, 220 and 230 are provided at a light output side of the white organic light emitting device WOLED and thus respectively transmit designated wavelengths of white light emitted from the white organic light emitting devices WOLED. For example, if the red sub-pixel R-SP, the green sub-pixel G-SP, the blue sub-pixel B-SP and the white sub-pixel W-SP form one pixel, as exemplarily shown in this figure, red, green and blue color filter layers 210, 220 and 230 may be correspondingly provided in the red sub-pixel R-SP, the green sub-pixel G-SP and the blue sub-pixel B-SP except for the white sub-pixel W-SP.

The white organic light emitting device WOLED may be formed by sequentially stacking a reflective electrode 120, a first transparent electrode 130, an organic stack 2000 including at least three light emitting units, a second transparent electrode 170 and a light compensation layer 180 in the upward direction from the lower portion thereof.

Here, the first transparent electrode 130 and the second transparent electrode 170 are transparent conductive oxide (TCO) films, light emitted from light emitting layers of the respective light emitting units of the organic stack 2000 passes through the second transparent electrode 170, and light emitted from the light emitting layers of the respective light emitting units and resonated within the second transparent electrode 170 is reflected by the reflective electrode 120 and then emitted to the second transparent electrode 170.

For example, the transparent conductive oxide (TCO) film is a transparent metal oxide film including at least one metal having a work function of 3.5 eV to 7 eV, selected from the group consisting of indium (In), tin (Sn), zinc (Zn), gallium (Ga), cadmium (Cd), hafnium (Hf) and zirconium (Zr). The first transparent electrode 130 and the second transparent electrode 170 may be mainly an indium tin oxide (ITO) film, an indium zinc oxide (IZO) film and/or an indium gallium zinc oxide (IGZO) film without being limited thereto, and any transparent electrode having a work function within the above-described range may be used as the first and second transparent electrodes 130 and 170.

Here, the reflective electrode 120 and the first transparent electrode 130 may be continuously formed through the same process. Further, the first transparent electrode 130 is formed prior to formation of the organic stack 2000, which is vulnerable to high temperature, and may thus be deposited at a high temperature of 200° C. or higher, but the second transparent electrode 170 formed after formation of the organic stack 2000 employs a transparent electrode which may be deposited at a temperature of 100° C. or lower, not influencing characteristics of the organic stack 2000. For example, the first transparent electrode 130 may be formed of indium thin oxide (ITO) and the second transparent electrode 170 may be formed of indium zinc oxide (IZO).

In the organic light emitting display device in accordance with the present disclosure, the white organic light emitting device WOLED is provided in the respective sub-pixels and thus emits white light in common and, in order to express various colors, the color filter layers 210, 220 and 230 which selectively transmit light of different wavelengths may be provided on the white organic light emitting device WOLED. As exemplarily shown in this figure, in the organic light emitting display device including the white sub-pixel W-SP, a color filter layer on the white sub-pixel W-SP may be omitted.

Further, in the above structure in which the reflective electrode 120 is provided under the first transparent electrode 130, light is emitted from the upper surface of the second transparent electrode 170 of the white organic light emitting device WOLED and, in order to improve outcoupling characteristics of light, the light compensation layer 180 may be further provided on the second transparent electrode 170.

The substrate 100 is generally divided into an active area provided at the center thereof and an outer area provided outside the active area. A plurality of sub-pixels SP is arranged in a matrix in the active area and thus image display is carried out in the active area.

Figure 2:
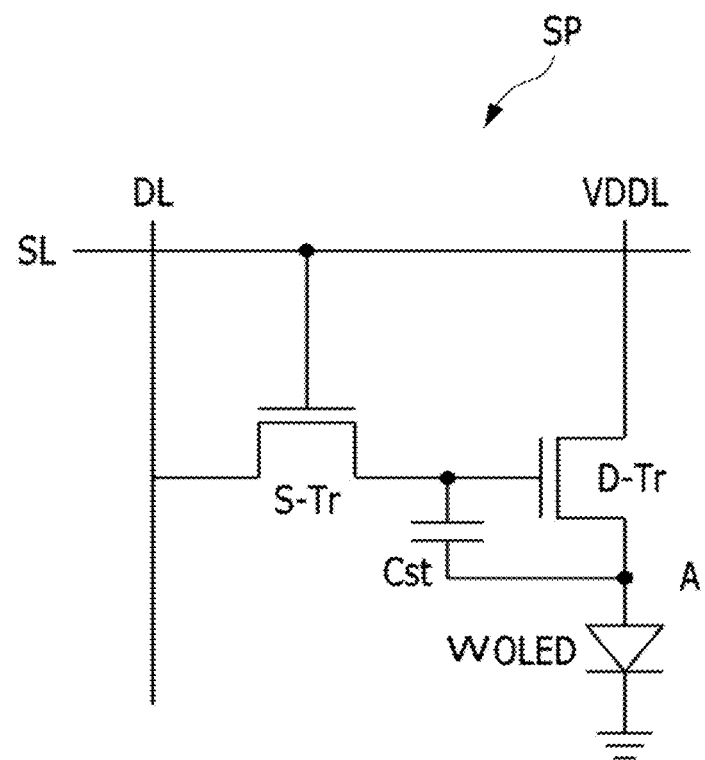
FIG. 2 is a circuit diagram illustrating a pixel circuit provided in one sub-pixel of FIG. 1 in accordance with an embodiment of the present disclosure.

FIG. 2 is a circuit diagram illustrating one sub-pixel SP of the organic light emitting display device in accordance with the present disclosure.

As exemplarily shown in FIG. 2, sub-pixels SP are divided from each other by scan lines SL and data lines DL intersecting each other. Further, in the active area AA, a driving voltage line VDDL, to which driving voltage is applied, is further provided in the same direction of the data lines DL so as to drive a pixel circuit provided in each sub-pixel SP, and the driving voltage line VDDL is connected to the driving thin film transistor D-Tr which is a part of the pixel circuit.

With reference to FIG. 2, the pixel circuit connected to the above-described lines will be described. The pixel circuit includes a switching thin film transistor S-Tr provided at an intersection of the scan line SL and the data line DL, the driving thin film transistor D-Tr provided between the switching thin film transistor S-Tr and the driving voltage line VDDL, a white organic light emitting device WOLED connected to the driving thin film transistor D-Tr, and a storage capacitor Cst provided between a gate electrode and a drain electrode (or a source electrode) of the driving thin film transistor D-Tr.

Here, the switching thin film transistor S-Tr is provided at an intersection area of the scan line SL and the data line DL and functions to select the corresponding sub-pixel SP. The driving thin film transistor D-Tr functions to drive the white organic light emitting device WOLED of the sub-pixel SP selected by the switching thin film transistor S-Tr. Here, the reflective electrode 120 and the first transparent electrode 130 of the white organic light emitting device WOLED are conductively connected to a first node A, at which the source electrode of the driving thin film transistor D-Tr is located, and the second transparent electrode 170 receives ground voltage in the outer area.

The reflective electrode 120 and the first transparent electrode 130 are divided according to the respective sub-pixels SP, and the remainder of the white organic light emitting device WOLED, i.e., the organic stack 2000, the second electrode 170 and the light compensation layer 180, is formed in common in at least the active area AA. Further, in the outer area, in order to protect the second electrode 170, the light compensation layer 180 may be formed to have a larger area than the second electrode 170 so as to cover the edge of the second electrode 170.

Hereinafter, the white organic light emitting device used in the organic light emitting display device in accordance with the present disclosure will be described.

Figure 3:
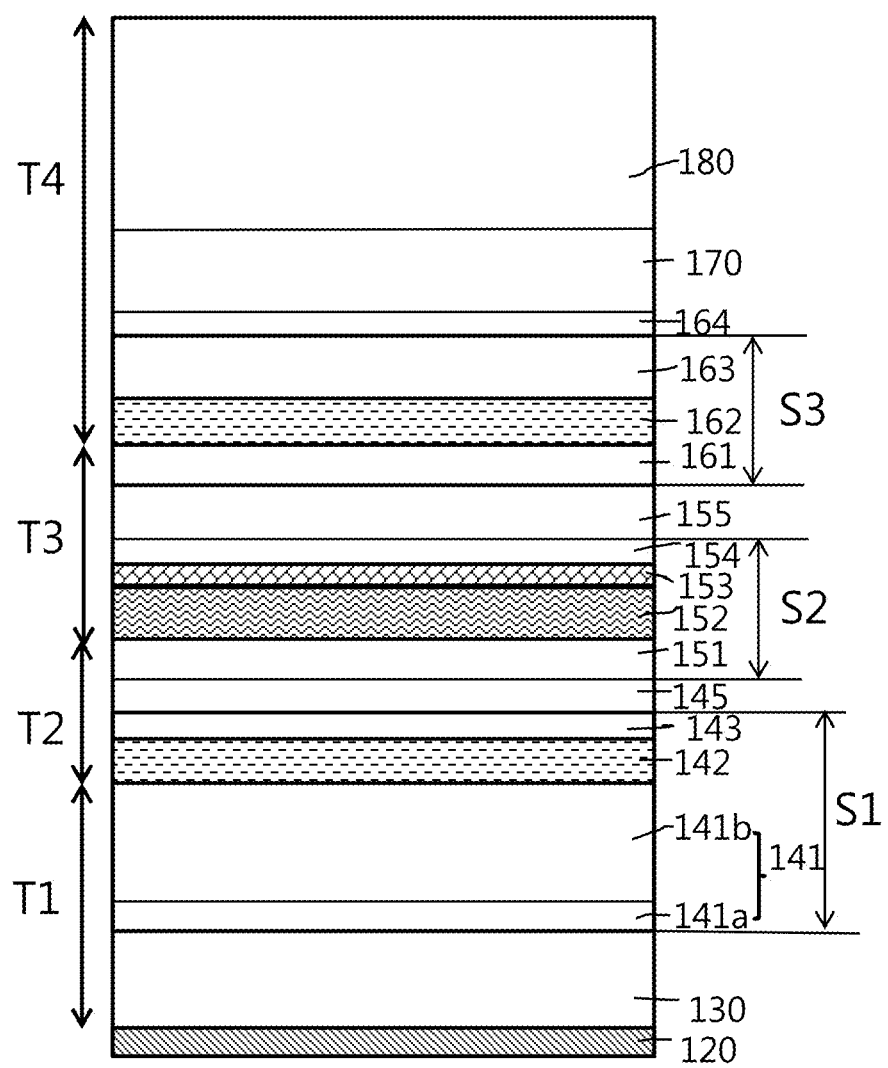
FIG. 3 is a cross-sectional view illustrating a white organic light emitting device in accordance with the present an embodiment of the present disclosure.
Figure 4:
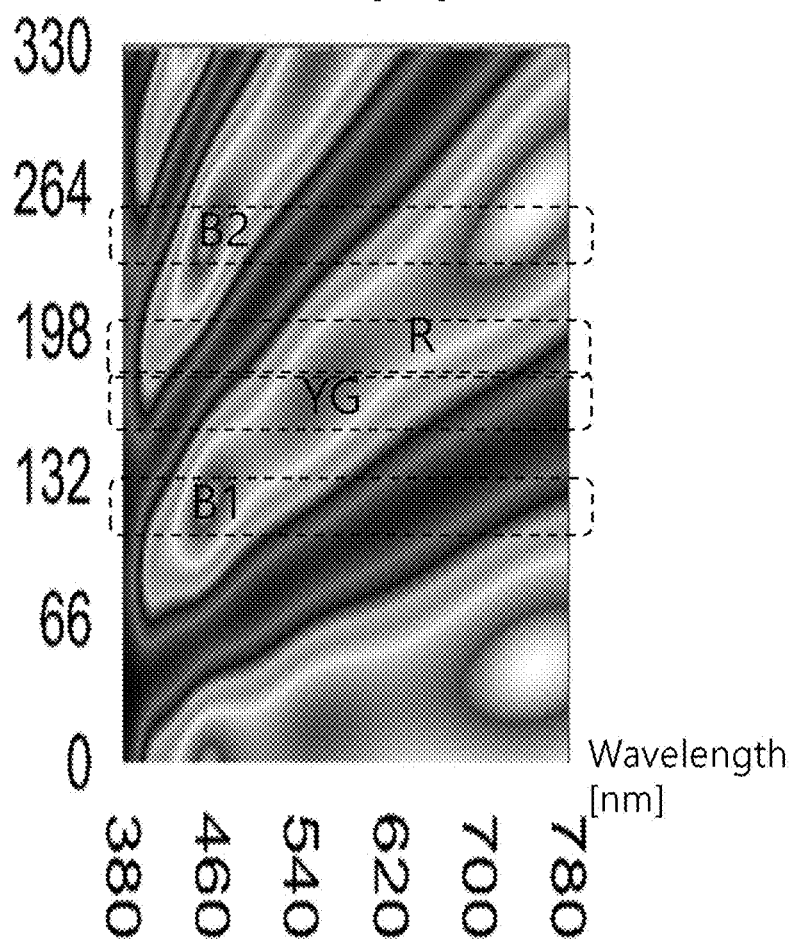
FIG. 4 is a contour map illustrating positions of light emitting layers of respective stacks of FIG. 3, corresponding to distances from a reflective electrode according to peak wavelengths in accordance with the present an embodiment of the present disclosure.

FIG. 3 is a cross-sectional view illustrating a white organic light emitting device in accordance with the present disclosure, and FIG. 4 is a contour map illustrating positions of light emitting layers of respective stacks of FIG. 3, corresponding to distances from a reflective electrode according to peak wavelengths.

As exemplarily shown in FIG. 3, the white organic light emitting device in accordance with the present disclosure includes a reflective electrode 120, a first transparent electrode 130 provided on the reflective electrode 120, three stacks S1, S2 and S3 provided thereon, and a second electrode 170 and a light compensation layer 180 provided thereon. The respective stacks S1, S2 and S3 may be divided from one another by charge generation layers 145 and 155. The charge generation layers 145 and 155 supply carriers of electrons or holes to the stacks S1, S2 and S3, which do not contact the electrodes, and may include a single layer or include an NP junction structure of an N-type charge generation layer and a P-type charge generation layer. Further, the N-type charge generation layer may include an electron-transporting organic material doped with an N-type dopant, and the P-type charge generation layer may include a hole-transporting organic material doped with a P-type dopant.

The elements provided above the reflective electrode 120 shown in FIG. 3 are layers influencing light resonance and light output characteristics. In the white organic light emitting device in accordance with the present disclosure, positions of light emitting layers of the respective stacks S1, S2 and S3 have significant meanings and, particularly, in order to secure a designated lifespan or more in the top emission type, the first electrode 130 and a first common layer 141 need to have a large thickness.

In more detail, a first blue stack S1 includes the first common layer 141, a first blue light emitting layer 142 and a second common layer 143, which are sequentially stacked on the first transparent electrode 130.

Here, the first common layer 141 may include a hole injection layer 141a and a hole transport layer 141b. In order to relieve stress at the interface between the first transparent electrode 130 and an organic material when holes are injected from the first transparent electrode 130 into the organic stack 2000, interface treatment may be carried out on the surface of the first transparent electrode 130 and then the hole injection layer 141a including a P-type dopant may be provided thereon. Further, the white organic light emitting device in accordance with the present disclosure solves shortening of the lifespan of blue light as compared to other colors of light when a distance from the upper surface of the reflective electrode 120 to the light emitting layer of the first stack S1 and, thus, a first distance T1 from at least the upper surface of the reflective electrode 120 to the lower surface of the first blue light emitting layer 142 is set to 1,200 Å to 1,300 Å. For this purpose, the first transparent electrode 130 has a thickness of 500 Å or more, and the first common layer 141 has a greater thickness than that of the first transparent electrode 130.

Further, a phosphorescent stack S2 emitting light of a longer wavelength than blue light is provided on the first blue stack S1. The phosphorescent stack S2 includes a third common layer 151, a phosphorescent light emitting layer 152 and 153 and a fourth common layer 154. In the phosphorescent stack S2, the phosphorescent light emitting layer 152 and 153 includes a yellow-green light emitting layer 152 and a red light emitting layer 153 contacting each other. A tandem stack structure may implement white light only by a blue stack and a yellow-green light emitting layer but, in the white organic light emitting device in accordance with the present disclosure, if the phosphorescent stack S2 includes only the yellow-green light emitting layer 152, a color reproduction range of red is insufficient and, thus, in order to prevent such a problem, the red light emitting layer 153 is further provided. In this case, the red light emitting layer 153 of the phosphorescent stack S2 does not have main luminescence characteristics but has auxiliary luminescence characteristics, and the yellow-green light emitting layer 152 has a greater thickness than the red light emitting layer 153 in the phosphorescent stack S2. A thickness ratio of the yellow-green light emitting layer 152 to the red light emitting layer 153 is about 2.5 to 5:1.

Further, a second blue stack S3 is provided on the phosphorescent stack S2. The second blue stack S3 includes a fifth common layer 161, a second blue light emitting layer 162 and a sixth common layer 163. An electron injection layer 164 to improve electron injection from the second transparent electrode 170 may be further provided on the sixth common layer 163.

The first to sixth common layers 141, 143, 151, 154 161 and 163 are not divided according to the sub-pixels SP and are provided in common, and have a basic function of transporting holes or electrons to the adjacent light emitting layers. The first, third and fifth common layers 141, 151 and 161 located at front ends of the light emitting layers of the respective stacks S1, S2 and S3 may be hole transport layers, and the second, fourth and sixth common layers 143, 154 and 163 located at rear ends of the light emitting layers of the respective stacks S1, S2 and S3 may be electron transport layers. In this case, the hole transport layer means a layer having higher hole mobility than electron mobility, and the electron transport layer means a layer having higher electron mobility than hole mobility. Further, in the white organic light emitting device in accordance with the present disclosure, among the common layers 141, 143, 151, 154 161 and 163, the first common layer 141 may have the greatest thickness. In this case, the position of the first blue light emitting layer 142 is defined using the thickness of the first common layer 141, and the thickness of the first common layer 141 defines an emission area (of the first blue light emitting layer 142) located at the lowermost position of the top emission type light emitting device having a multi-stack structure.

If each of the charge generation layers 145 and 155 provided among the respective stacks S1, S2 and S3 includes two layers, i.e., an N-type charge generation layer and a P-type charge generation layer, the lower N-type charge generation layer may be formed continuously after formation of the electron transport layer of the adjacent lower stack by partially changing a dopant, and the upper P-type charge generation layer may be formed continuously after formation of the hole transport layer of the adjacent upper stack by partially changing a dopant.

In the white organic light emitting device in accordance with the present disclosure, a ratio of the first distance T1 from the upper surface of the reflective electrode 120 to the lower surface of the first blue light emitting layer 142 to a second distance T2 from the lower surface of the first blue light emitting layer 142 to the lower surface of the yellow-green light emitting layer 152 to a third distance T3 from the lower surface of the yellow-green light emitting layer 152 to the lower surface of the second blue light emitting layer 162 to a fourth distance T4 from the lower surface of the second blue light emitting layer 162 to the upper surface of the light compensation layer 180 is 2:1:1.5:4 (T1:T2:T3:T4), and such a distance ratio is deduced in consideration of efficiencies, color reproduction ranges and lifespans of the respective light emitting stacks S1, S2 and S3. Particularly, in the white organic light emitting device in accordance with the present disclosure, the ratio (2:1) of the first distance T1 from the upper surface of the reflective electrode 120 to the lower surface of the first blue light emitting layer 142 to the second distance T2 from the lower surface of the first blue light emitting layer 142 to the lower surface of the yellow-green light emitting layer 152 is significant.

Further, in the white organic light emitting device in accordance with the present disclosure, the organic stack 2000 includes organic layers including organic materials as main ingredients and provided between the first transparent electrode 130 and the second transparent electrode 170. As circumstances require, the electron injection layer 164 of the organic stack 2000 may be a thin inorganic layer including a metallic compound.

The total thickness (T1+T2+T3+T4) of the white organic light emitting device in accordance with the present disclosure including the distance from the upper surface of the lower reflective electrode 120 to the light compensation layer 180 to improve out-coupling of the organic stack 2000 is 5,100 Å to 5,250 Å.

Further, in the white organic light emitting device in accordance with the present disclosure, the positions of the light emitting layers of the respective stacks may be determined through FIG. 4, which is a contour map illustrating an emission spectrum according to distances from the upper surface of the reflective electrode to respective light emitting layers of the organic stack 2000. With reference to FIG. 4, positions emitting the maximum intensities of light may be found at wavelengths of about 460 nm, 550 nm and 630 nm and, in consideration of the lifespan of the white organic light emitting device in accordance with the present disclosure, the position B1 of the first blue light emitting layer 142 of the first blue stack S1 which is closest to the first transparent electrode 130 is determined as a position represented by a second blue peak out of three optimum blue peaks located within a distance between the first and second transparent electrodes 130 and 170. Further, since the position YG of the yellow-green light emitting layer 152 of the phosphorescent stack S2 should be located on the first blue light emitting layer 142 and thus be located close to the position B1 of the first blue light emitting layer 142, a distance between the first blue light emitting layer 142 of the first blue stack S1 and the yellow-green light emitting layer 152 of the phosphorescent stack S2 is short.

Although FIG. 4 exemplarily illustrates that materials emitting light of wavelengths of about 460 nm, 550 nm and 630 nm are used as dopants of the blue, yellow-green and red light emitting layers, the dopants are not limited thereto and a material emitting light of a wavelength of 430 nm to 460 nm may be selected as the dopant of the blue light emitting layer, a material emitting light of a wavelength of 520 nm to 560 nm may be selected as the dopant of the yellow-green light emitting layer, and a material emitting light of a wavelength of 620 nm to 640 nm may be selected as the dopant of the red light emitting layer. As circumstances require, the yellow-green light emitting layer may use a dopant which emits light of a green wavelength instead of the dopant which emits light of the yellow-green wavelength.

Therefore, the first distance T1 from the upper surface of the reflective electrode 120 to the lower surface of the first blue light emitting layer 142 corresponds to 1,200 Å to 1,300 Å, and the first transparent electrode 130 and the first common layer 141 are located within the first distance T1. In this case, the first transparent electrode 130 has a thickness of 500 Å or more, and the first common layer 141 provided thereon has a greater thickness than that of the first transparent electrode 130. Further, the first common layer 141 includes the hole injection layer 141a and the hole transport layer 141b, the hole injection layer 141a has a thickness of about 20 Å to 200 Å, and the hole transport layer 141b has a thickness of about 300 Å to 700 Å. The hole transport layer 141b may include two or more layers formed of materials having different band gaps, as circumstances required. In the white organic light emitting device in accordance with the present disclosure, the total thickness of the first transparent electrode 130 and the first common layer 141 contacting the first transparent electrode 130 of the first blue stack S1 is sufficient, i.e., 1,200 Å to 1,300 Å, holes injected from the first transparent electrode 130 pass through the first common layer 141 having the sufficient thickness, are supplied to the first blue light emitting layer 142, and thus maintain carrier balance with electrons supplied via two or more upper stacks, thereby preventing shortening of lifespan. Further, the reason why the thickness of the first blue light emitting layer 142 is greater than the thickness of the first transparent electrode 130 is that a transport distance of holes is a designated distance or longer so as to secure a sufficient lifespan and the blue light emission area B1 may be formed at a position at which resonance characteristics are considered in FIG. 4 only if the holes move a designated distance or longer to reach the first blue light emitting layer 142.

In the white organic light emitting device in accordance with the present disclosure, since the position represented by the second blue peak out of the three optimum blue peaks located within the distance between the first and second transparent electrodes 130 and 170 is selected as the position of the first blue light emitting layer 142, the phosphorescent light emitting layer, i.e., the yellow-green and red light emitting layers 152 and 153, formed above the first blue light emitting layer 142, is located within the second distance T2 from the first blue light emitting layer 142, which is shorter than the first distance T1 from the upper surface of the reflective electrode 120 to the lower surface of the first blue light emitting layer 142. Here, the second common layer 143, the first charge generation layer 145 and the third common layer 151 are located within the second distance T2, and these layers 143 and 145 and 151 may have small thicknesses, as compared to corresponding layers included in other stacks.

Further, the position B2 of the second blue light emitting layer 162 is determined as a position represented by third blue peak out of the three optimum blue peaks located within the distance between the first and second transparent electrodes 130 and 170. Here, the third distance T3 from the lower surface of the yellow-green light emitting layer 152, i.e., the lower light emitting layer of the yellow-green light emitting layers 152 and the red light emitting layers 153, to the lower surface of the second blue light emitting layer 162 of the second blue stack S3 corresponds to about 870 Å to 950 Å. In this case, since yellow-green light has the greatest efficiency when white light is emitted, the thickness of the yellow-green light emitting layer 152 is greater than the thickness of the first or second blue light emitting layer 142 or 162 or the thickness of the red light emitting layer 153. A thickness ratio of the yellow-green light emitting layer 152 to the red light emitting layer 153 is 2.5 to 5:1. Further, the total thickness of the phosphorescent light emitting layer including the yellow-green light emitting layer 152 and the red light emitting layer 153 occupies ⅓ to ½ of the third distance T3.

Further, the second blue stack S3 is provided so as to improve efficiency of blue light which is relatively low, as compared to other colors of light, and, as needed, the first blue stack S1 and the second blue stack S2 may use dopants emitting light of different blue wavelengths or have different thicknesses. For example, the second blue light emitting layer 162 may use a dopant emitting light of a shorter wavelength (light of deep blue) than the first blue light emitting layer 142 or have a greater thickness than that of the first blue light emitting layer 142, thus being capable of compensating for viewing angle characteristics and optimizing optical characteristics.

The fourth distance T4 from the lower surface of the second blue light emitting layer 162 to the upper surface of the light compensation layer 180 is about 2,350 Å to 2,450 Å. Here, the light compensation layer 180 may use an organic material having a refractive index of 1.9 or more, and the used organic material may be an organic material included in the organic stack 2000 (including the layers between the first transparent electrode 130 and the second transparent electrode 170). Among single layers from the reflective electrode 120 to the light compensation layer 180, the light compensation layer 180 may have the greatest thickness and, in order to secure out-coupling and viewing angle characteristics, the thickness of the light compensation layer 180 may be 800 Å to 1,200 Å.

Since the second electrode 170 is located on the organic stack 2000, the second electrode 170 is a transparent electrode which may be formed through a low-temperature deposition process. For example, the second electrode 170 may be a transparent electrode formed of indium zinc oxide (IZO), or be a transparent electrode formed of other materials which may be formed at a temperature of 100° C. or lower. IZO may be deposited at a temperature close to room temperature. Further, the second electrode 170 has a thickness of about 300 Å to 600 Å and the reason for this is that, when the second electrode 170 is formed to have a thickness exceeding the above range, if the second electrode 170 includes foreign substances, it is difficult to detect the foreign substances and repair the second electrode 170 due to the characteristics of the second electrode 170 having a low density formed through the low-temperature deposition process. Therefore, the second electrode 170 is formed to have a lower thickness than the first electrode 130.

Further, the charge generation layers 145 and 155 provided among the respective stacks S1, S2 and S3 function to supply carriers of holes and electrons to the adjacent stacks S1, S2 and S3 and, thus, have thicknesses of 100 Å or more so as to secure lifespan characteristics. Here, the first charge generation layer 145 may have a thickness of 210 Å in consideration of the short second distance T2, and the second charge generation layer 155 located within the relatively long third distance T3 may have a greater thickness than that of the first charge generation layer 145, i.e., a thickness of about 300 Å or less.

The above-described first and second blue stacks S1 and S3 have a fluorescent light emitting structure and use a fluorescent blue dopant, which maintains charge balance and has stable combination between lifespan and optical efficiency when blue light is combined with yellow-green light and red light emitted from the phosphorescent stack S2 to produce white light, as blue light emitting materials. If a phosphorescent blue dopant is used, the second blue stack S3 may be omitted or the thickness of the second blue stack S3 may be changed.

Although the above-described embodiment of the present disclosure describes that the white organic light emitting device includes three stacks, a stack including a green light emitting layer or a red light emitting layer may be added so as to improve a color reproduction range. As the number of stacks is increased, the thickness of the light compensation layer 180 may be reduced.

Figure 5:
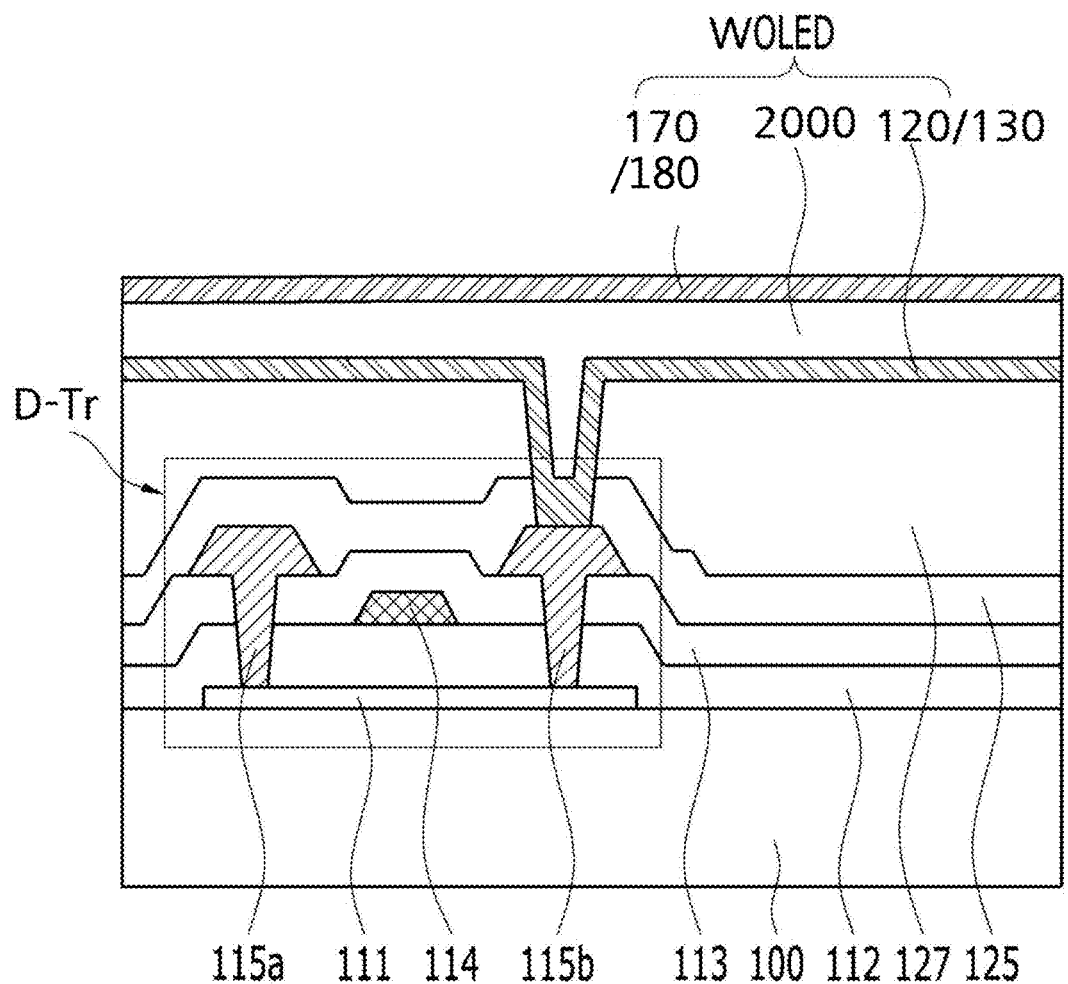
FIG. 5 is a cross-sectional view illustrating one sub-pixel of the organic light emitting display device in accordance with an embodiment of the present disclosure.

FIG. 5 a cross-sectional view illustrating one sub-pixel of the organic light emitting display device in accordance with the present disclosure.

As exemplarily shown in FIG. 5, the organic light emitting display device in accordance with the present disclosure includes a pixel circuit including a driving thin film transistor D-Tr, and a white organic light emitting device WOLED connected to the driving thin film transistor D-Tr, in each sub-pixel.

The cross-section of the driving thin film transistor D-Tr will be described as follows. The driving thin film transistor D-Tr includes a semiconductor layer 111 formed on a substrate 100, a gate electrode 114 located so as to correspond to a part of the semiconductor layer 111, and a drain electrode 115a and a source electrode 115b connected to both ends of the semiconductor layer 111.

The driving thin film transistor D-Tr having such a configuration may have a layered structure similar to the above-described switching thin film transistor S-Tr.

The gate electrode 114 may be formed of a metal of the same layer as the scan lines SL, and the source electrode 115b and the drain electrode 115a may be formed of a metal of the same layer as the data lines DL.

Further, a gate insulating film 112 may be provided between the semiconductor layer 111 and the gate electrode 114 so that the semiconductor layer 111 and the gate electrode 114 are insulated from each other, an interlayer insulating film 113 may be provided between the gate electrode 114 and the source/drain electrodes 115a/115b, and first and second protective films 125 and 127 may be provided between the source/drain electrodes 115a/115b and the reflective electrode 120 except for a connection part. The first protective film 125 may be an inorganic protective film, and the second protective film 127 may be an organic protective film.

Further, the reflective electrode 120 is connected to the source electrode 115b of the driving thin film transistor D-Ts through a contact hole provided at parts of the first and second protective films 125 and 127.

The layered structure of the white organic light emitting device WOLED was described above with reference to FIGS. 3 and 4 and a detailed description thereof will thus be omitted. In the organic light emitting display device in accordance with the present disclosure, at least the organic stack 2000, the second transparent electrode 170 and the light compensation electrode 180 of the white organic light emitting device WOLED are continuously formed in common without cutting in all sub-pixels SP and, thus, use of a deposition mask to form each layer may be omitted.

Hereinafter, a test in which a white organic light emitting device in accordance with a test example of the present disclosure and a white organic light emit device in accordance with a comparative example are compared with each other will be described.

Figure 6:
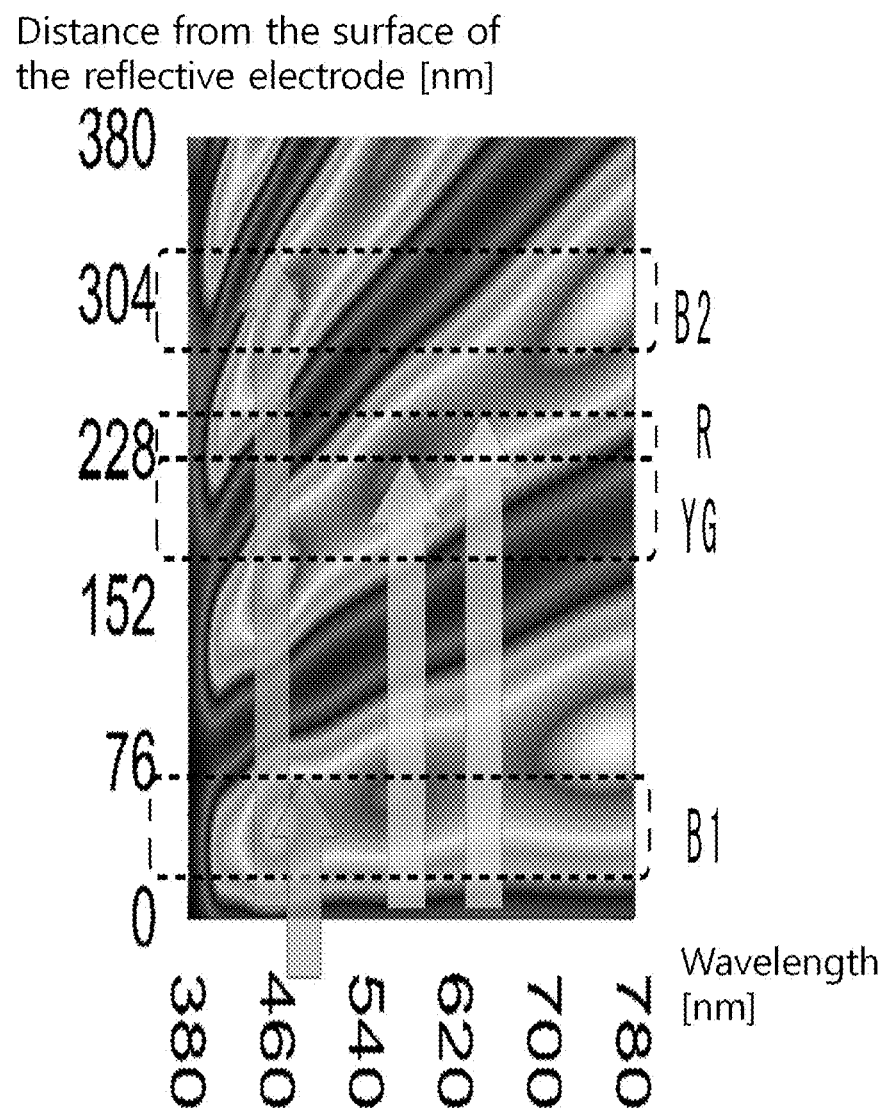
FIG. 6 is a contour map of a white organic light emitting device in accordance with an embodiment of a comparative example.

FIG. 6 is a contour map of the white organic light emitting device in accordance with the comparative example.

First, a structure of the white organic light emitting device in accordance with the comparative example will be described. The white organic light emitting device in accordance with the comparative example has the same stacked configuration from the reflective electrode to the light compensation layer as the white organic light emitting device in accordance with the test example of the present disclosure, but, as exemplarily shown in FIG. 6, the position of a first blue light emitting layer of a first blue stack is determined as a position represented by a first blue peak out of three optimum blue peaks located within a distance between first and second transparent electrodes. Thereby, a distance from the upper surface of the reflective electrode to the first blue light emitting layer is very short, and a distance from the first blue light emitting layer to a yellow-green light emitting layer is relatively long.

Particularly, in the comparative example, a first transparent electrode on the reflective electrode has a thickness of 70 Å, corresponding to the minimum thickness to which sputtering is applicable, and, in this case, it is found that lifespan decrease occurs due to decrease of sheet resistance increase and lowering of dispersion of the first transparent electrode. Further, in the structure in accordance with the comparative example, when the thicknesses of the reflective electrode and a first common layer are increased, the position of the first blue light emitting layer deviates from the first optimum blue peak and thus reduction of luminance and degradation of color coordinate characteristics occur due to degradation of cavity characteristics. Therefore, increase in the thicknesses of the first transparent electrode and the first common layer is not considered in the comparative example.

In the white organic light emitting device in accordance with the present disclosure, in order to secure a sufficient lifespan, the position of the first blue light emitting layer 142 is adjusted so that the thicknesses of the first transparent electrode 130 and the first common layer 141 are increased between the reflective electrode 120 and the second transparent electrode 170 and, particularly, a ratio of a distance from the reflective electrode 120 to a light emitting layer to distances to light emitting layers of adjacent stacks is adjusted to a specific ratio and, thereby, the white organic light emitting device in accordance with the present disclosure has optimum cavity characteristics.

Figure 7A:
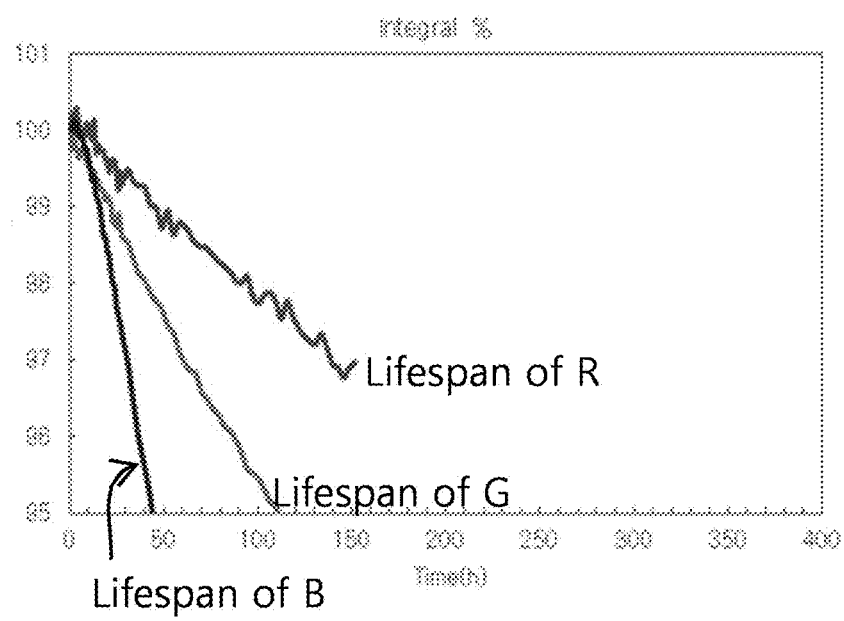
FIGS. 7A and 7B are graphs illustrating lifespans of red, green and blue lights of the white organic light emitting device in accordance with the comparative example and the white organic light emitting device in accordance with an embodiment of the present disclosure.
Figure 7B:
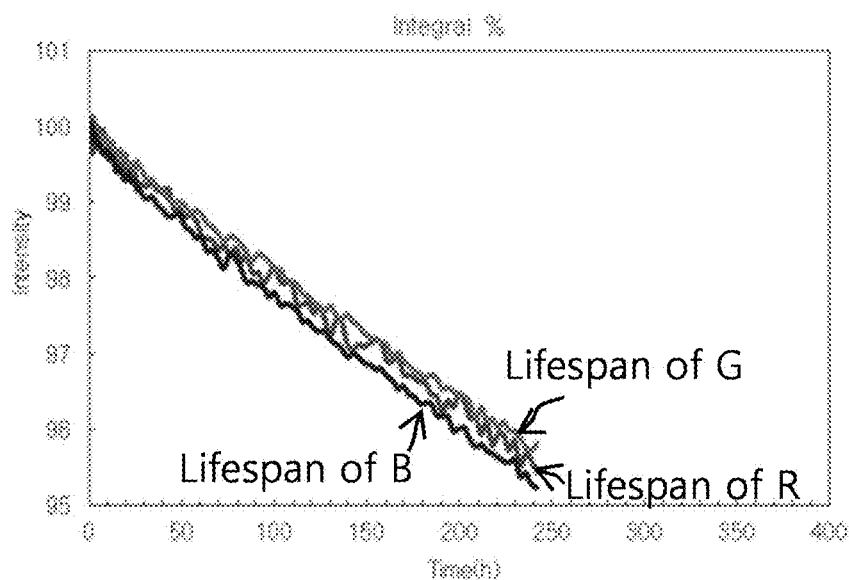
Figure 8:
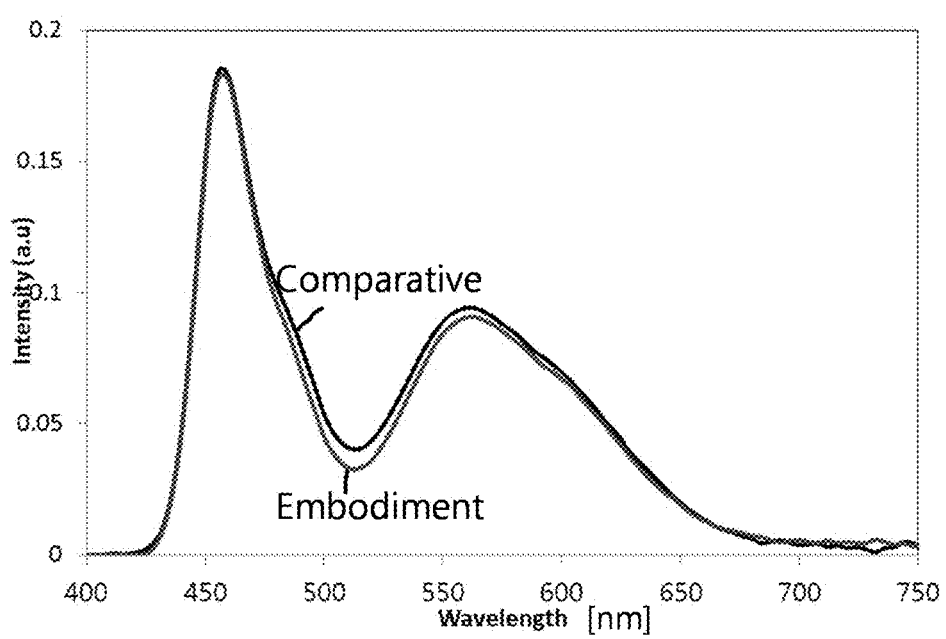
FIG. 8 is a graph illustrating intensities of light according to wavelengths in the white organic light emitting device in accordance with the comparative example and the white organic light emitting device in accordance with an embodiment of the present disclosure.

FIGS. 7A and 7B are graphs illustrating lifespans of red, green and blue lights of the white organic light emitting device in accordance with the comparative example and the white organic light emitting device in accordance with the test example of the present disclosure, and FIG. 8 is a graph illustrating intensities of light according to wavelengths in the white organic light emitting device in accordance with the comparative example and the white organic light emitting device in accordance with the test example of the present disclosure.

TABLE 1

| Characteristics | | Comparative Example | Embodiment Example |
|---|---|---|---|
| Efficiency (Cd/A) (at full white) | R | 4.01 | 3.76 |
| | G | 13.3 | 12.1 |
| | B | 1.79 | 1.67 |
| | W | 47.0 | 43.9 |
| Color Coordinates | Wx | 0.310 | 0.310 |
| | Wy | 0.314 | 0.306 |
| Color Viewing Angle | TP (Δu'v') | 0.013 | 0.014 |
| Current Density (100 mA/cm$^2$) | Driving Voltage | 16.36 | 15.91 |
| Color Reproduction Range | BT2020 | 72.7 | 72.8 |
| | DCI | 97.5 | 97.7 |
| Panel luminance | FW | 200 | 180 |
| | Peak | 763 | 683 |
| T95 (Hours) (40° C., 22.5 mA/cm$^2$) | R | 210 | 225 |
| | G | 135 | 245 |
| | B | 75 | 235 |
| | ΔV (V) | 0.7 | 0.4 |

With reference to Table 1, it is understood that, the white organic light emitting device in accordance with the Embodiment example of the present disclosure has slightly lower R, G, B and W efficiencies at full white than the white organic light emitting device in accordance with the comparative example, but the reason for this is that a relatively low driving voltage (15.91 V) is applied to the white organic light emitting device in accordance with the embodiment example of the present disclosure, as compared to the white organic light emitting device in accordance with the comparative example. When white spectra of the white organic light emitting device in accordance with the comparative example and the white organic light emitting device in accordance with the embodiment example of the present disclosure are observed through FIG. 8, main peaks of the first and second blue stacks S1 and S3 and the phosphorescent stacks S2 of the white organic light emitting device in accordance with the comparative example and the white organic light emitting device in accordance with the Embodiment example of the present disclosure are similar to each other and, thus, it is understood that both the white organic light emitting device in accordance with the comparative example and the white organic light emitting device in accordance with the Embodiment example of the present disclosure may similarly implement white light.

However, in the white organic light emitting device in accordance with the embodiment example of the present disclosure, although a low driving voltage is applied thereto, it is understood that color reproduction ranges estimated using BT2020 and DCI are excellent, as compared to the white organic light emitting device in accordance with the comparative example.

Further, with reference to Table 1 and FIG. 7A, if the white organic light emitting display device in accordance with the comparative example is applied, it is understood that lifespans are decreased (T95) in order of red, green and blue from an initial state until efficiency reaches 95% and, such lifespan differences become stark as time passes.

On the other hand, with reference to Table 1 and FIG. 7B, if the white organic light emitting display device in accordance with the embodiment example of the present disclosure is applied, it is understood that lifespans of red, green and blue lights are uniformly changed and such a fact represents no lifespan differences according to colors as time passes and thus means that the white organic light emitting display device in accordance with the Embodiment example of the present disclosure has a stable color display function despite driving of the white organic light emitting device for a long time.

Further, it may be understood that the white organic light emitting display device in accordance with the comparative example has a considerable driving voltage variation (ΔV) of 0.7 V, but the white organic light emitting display device in accordance with the embodiment example of the present disclosure a relatively small driving voltage variation (ΔV) of 0.4 V.

That is, the white organic light emitting display device in accordance with the embodiment example of the present disclosure increases the thickness of the first transparent electrode and the thickness of the first common layer so as to reduce sheet resistance of the first transparent electrode and to improve hole injection effects through increase in a Wf value, and spaces the first blue light emitting layer apart from the reflective electrode by a distance of 1,000 Å or longer so as to improve the lifespan of the blue light emitting layer and to improve charge balance.

As apparent from the above description, a white organic light emitting device and an organic light emitting display device using the same in accordance with the present disclosure have effects as follows.

In the white organic light emitting device and the organic light emitting display device in accordance with the present disclosure, a distance from the upper surface of a reflective electrode to a first blue light emitting layer of a first blue stack is set to 1,000 Å or longer, the first blue light emitting layer of the first blue stack and a light emitting layer of a phosphorescent stack are arranged close to each other and, thus, the thickness of a first transparent electrode and the thickness of a first common layer may be increased, sheet resistance of the first transparent electrode may be reduced, hole injection effects through increase in a Wf value may be improved, the lifespan of the blue light emitting layer may be improved and charge balance may be improved.

Further, the white organic light emitting device and the organic light emitting display device in accordance with the present disclosure uniformly maintain lifespans of light emitting layers emitting different colors of light and may thus stably implement white light despite driving of the white organic light emitting device for a long time.

Moreover, the white organic light emitting device and the organic light emitting display device in accordance with the present disclosure improve charge balance through control of thicknesses of layers provided in the first blue stack, which has a relatively high degradation rate, and may thus increase a color reproduction range of the device.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A white organic light emitting device comprising:
   a reflective electrode;
   a first transparent electrode on the reflective electrode;
   a first blue stack on the first transparent electrode, the first blue stack comprising a first common layer, a first blue light emitting layer, and a second common layer;
   a phosphorescent stack on the first blue stack, the phosphorescent stack comprising a third common layer, a phosphorescent light emitting layer, and a fourth common layer;
   a second blue stack on the phosphorescent stack, the second blue stack comprising a fifth common layer, a second blue light emitting layer, and a sixth common layer;
   a second transparent electrode on the second blue stack; and
   a light compensation layer directly on the second transparent electrode,
   wherein each of the first common layer, the third common layer, and the fifth common layer comprises at least one hole transport layer, and each of the second common layer, the fourth common layer, and the sixth common layer comprises at least one electron transport layer,
   wherein a thickness of the first common layer is greatest among thicknesses of the first to sixth common layers,
   wherein light emitted from the first blue light emitting layer, the phosphorescent light emitting layer, and the second blue light emitting layer resonates between the reflective electrode and the second transparent electrode, and passes through the second transparent electrode,
   wherein among a first distance from an upper surface of the reflective electrode to a lower surface of the first blue light emitting layer, a second distance from the lower surface of the first blue light emitting layer to a lower surface of the phosphorescent light emitting layer, and a third distance from the lower surface of the phosphorescent light emitting layer to a lower surface of the second blue light emitting layer, the first distance is thickest,
   wherein a ratio of the first distance to the second distance to the third distance to a fourth distance from the lower surface of the second blue light emitting layer to an upper surface of the light compensation layer is 2:1:1.5:4, and
   wherein the light compensation layer includes an organic material which is included in at least one layer between the first transparent electrode and the second transparent electrode.

2. The white organic light emitting device according to claim 1, wherein the phosphorescent light emitting layer comprises a red light emitting layer and a yellow-green light emitting layer that contact each other.

3. The white organic light emitting device according to claim 2, wherein
   peak wavelengths of the first blue light emitting layer and the second blue light emitting layer are within a wavelength range of 430 nm to 460 nm,
   a peak wavelength of the red light emitting layer is within a wavelength range of 620 nm to 640 nm, and
   a peak wavelength of the yellow-green light emitting layer is within a wavelength range of 520 nm to 560 nm.

4. The white organic light emitting device according to claim 1, wherein the first distance is 1,200 Å to 1,300 Å.

5. The white organic light emitting device according to claim 4, wherein the first transparent electrode has a thickness of 500 Å or more, and a thickness of the first common layer is greater than the thickness of the first transparent electrode.

6. The white organic light emitting device according to claim 4, wherein a total thickness from the first transparent electrode to the light compensation layer is 5,100 Å to 5,250 Å.

7. The white organic light emitting device according to claim 6, wherein the light compensation layer has a refractive index of 1.9 or more and a thickness of 800 Å to 1,200 Å.

8. The white organic light emitting device according to claim 7, wherein the second transparent electrode has a thickness of 300 Å to 600 Å less than a thickness of the first transparent electrode.

9. The white organic light emitting device according to claim 1, further comprising a first charge generation layer between the first blue stack and the phosphorescent stack, and a second charge generation layer between the phosphorescent stack and the second blue stack.

10. An organic light emitting display device comprising:
    a substrate;
    a plurality of pixels on the substrate;
    a driving transistor in each of the plurality of sub-pixels on the substrate;
    a reflective electrode connected to the driving transistor;
    a first transparent electrode on the reflective electrode;
    a first blue stack on the first transparent electrode, the first blue stack comprising a first common layer, a first blue light emitting layer and a second common layer;
    a phosphorescent stack on the first blue stack, the phosphorescent stack comprising a third common layer, a phosphorescent light emitting layer and a fourth common layer;
    a second blue stack on the phosphorescent stack, the second blue stack comprising a fifth common layer, a second blue light emitting layer, and a sixth common layer;
    a second transparent electrode directly on the second blue stack;

a light compensation layer on the second transparent electrode; and a color filter layer that corresponds to at least one of the plurality of sub-pixels on the light compensation layer, wherein each of the first common layer, the third common layer and the fifth common layer comprises at least one hole transport layer, and each of the second common layer, the fourth common layer and the sixth common layer comprises at least one electron transport layer, wherein among the first to sixth common layers, the first common layer has a greatest thickness, wherein light emitted from the first blue light emitting layer, the phosphorescent light emitting layer, and the second blue light emitting layer resonates between the reflective electrode and the second transparent electrode, and passes through the second transparent electrode, wherein among a first distance from an upper surface of the reflective electrode to a lower surface of the first blue light emitting layer, a second distance from the lower surface of the first blue light emitting layer to a lower surface of the phosphorescent light emitting layer, and a third distance from the lower surface of the phosphorescent light emitting layer to a lower surface of the second blue light emitting layer, the first distance is thickest, wherein a ratio of the first distance to the second distance to the third distance to a fourth distance from the lower surface of the second blue light emitting layer to an upper surface of the light compensation layer is 2:1:1.5:4, and wherein the light compensation layer includes an organic material which is included in at least one layer between the first transparent electrode and the second transparent electrode.

11. The organic light emitting display device according to claim 10, wherein the phosphorescent light emitting layer comprises a red light emitting layer and a yellow-green light emitting layer that contact each other.

12. The organic light emitting display device according to claim 11, wherein
peak wavelengths of the first blue light emitting layer and the second blue light emitting layer are within a wavelength range of 430 nm to 460 nm,
a peak wavelength of the red light emitting layer is within a wavelength range of 620 nm to 640 nm, and
a peak wavelength of the yellow-green light emitting layer is within a wavelength range of 520 nm to 560 nm.

13. The organic light emitting display device according to claim 10, wherein the first distance is 1,200 Å to 1,300 Å.

14. The organic light emitting display device according to claim 13, wherein the first transparent electrode has a thickness of 500 Å or more, and a thickness of the first common layer is greater than the thickness of the first transparent electrode.

15. The organic light emitting display device according to claim 13, wherein a total thickness from the first transparent electrode to the light compensation layer is 5,100 Å to 5,250 Å.

16. The organic light emitting display device according to claim 15, wherein the light compensation layer has a refractive index of 1.9 or more and a thickness of 800 Å to 1,200 Å.

17. The organic light emitting display device according to claim 16, wherein the second transparent electrode has a thickness of 300 Å to 600 Å less than that of the first transparent electrode.

18. The organic light emitting display device according to claim 10, further comprising a first charge generation layer between the first blue stack and the phosphorescent stack, and a second charge generation layer between the phosphorescent stack and the second blue stack.

* * * * *